US009608024B2

(12) United States Patent
Lee et al.

(10) Patent No.: US 9,608,024 B2
(45) Date of Patent: Mar. 28, 2017

(54) CMOS IMAGE SENSOR FOR REDUCING DEAD ZONE

(71) Applicant: SAMSUNG ELECTRONICS CO., LTD., Suwon-si (KR)

(72) Inventors: Seung Wook Lee, Yongin-si (KR); Yi Tae Kim, Hwaseong-si (KR); Jong Eun Park, Seongnam-si (KR); Jung Chak Ahn, Yongin-si (KR); Kyung Ho Lee, Suwon-si (KR); Tae Hun Lee, Suwon-si (KR); Hee Geun Jeong, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 14/872,691

(22) Filed: Oct. 1, 2015

(65) Prior Publication Data
US 2016/0099267 A1    Apr. 7, 2016

(30) Foreign Application Priority Data

Oct. 2, 2014    (KR) .................. 10-2014-0133147

(51) Int. Cl.
*H01L 31/062*  (2012.01)
*H01L 31/113*  (2006.01)
(Continued)

(52) U.S. Cl.
CPC .... *H01L 27/1463* (2013.01); *H01L 27/14603* (2013.01); *H01L 27/14621* (2013.01);
(Continued)

(58) Field of Classification Search
CPC ......... H01L 27/14643; H01L 27/14636; H01L 27/1463; H01L 27/14627; H01L 27/14621
(Continued)

(56) References Cited

U.S. PATENT DOCUMENTS 7,459,735 B2    12/2008    Ezaki et al.
8,378,399 B2    2/2013    Maeda
(Continued)

FOREIGN PATENT DOCUMENTS

JP    2010-258157 A    11/2010
JP    2011-222900 A    11/2011
(Continued)

*Primary Examiner* — Theresa T Doan
(74) *Attorney, Agent, or Firm* — Sughrue Mion, PLLC

(57) ABSTRACT

An image sensor such as a complementary metal-oxide-semiconductor (CMOS) image sensor and a method of manufacturing the same are provided. The CMOS image sensor includes: a semiconductor substrate including a first surface and a third surface formed by removing a part of the semiconductor substrate from a second surface opposite to the first surface; a plurality of active regions which are formed between the first surface and the third surface and each of which includes a photoelectric conversion element generating charges in response to light input through the third surface; and an isolation region vertically formed from either of the first and third surfaces to isolate the active regions from one another. When the CMOS image sensor is viewed from the above of the third surface, each of the active regions may have round corners and concave sides.

17 Claims, 14 Drawing Sheets

(51) Int. Cl.
*H01L 27/146* (2006.01)
*H04N 5/374* (2011.01)
*H04N 9/04* (2006.01)

(52) U.S. Cl.
CPC .. *H01L 27/14627* (2013.01); *H01L 27/14636* (2013.01); *H01L 27/14689* (2013.01); *H04N 5/374* (2013.01); *H04N 9/045* (2013.01)

(58) Field of Classification Search
USPC ............................ 257/292, 294, 462; 438/48
See application file for complete search history.

(56) References Cited

U.S. PATENT DOCUMENTS

| | | | |
|---|---|---|---|
| 8,390,089 B2 | 3/2013 | Chen et al. | |
| 8,390,707 B2 | 3/2013 | Yamashita | |
| 8,704,282 B2* | 4/2014 | Marty | H01L 27/1463 257/292 |
| 2012/0153127 A1 | 6/2012 | Hirigoyen et al. | |
| 2013/0293751 A1 | 11/2013 | Vaartstra et al. | |
| 2013/0321685 A1 | 12/2013 | Ahn et al. | |

FOREIGN PATENT DOCUMENTS

| | | |
|---|---|---|
| JP | 2013-30803 A | 2/2013 |
| JP | 2013-175494 A | 9/2013 |

\* cited by examiner

CMOS IMAGE SENSOR FOR REDUCING DEAD ZONE

CROSS-REFERENCE TO THE RELATED APPLICATIONS

This application claims priority from Korean Patent Application No. 10-2014-0133147 filed on Oct. 2, 2014, the disclosure of which is hereby incorporated by reference in its entirety.

BACKGROUND

Apparatuses and methods consistent with exemplary embodiments of the inventive concept relate to a pixel for an image sensor such as a complementary metal-oxide-semiconductor (CMOS) image sensor and an image sensor including the same.

CMOS image sensors are solid-state sensing devices using CMOS. CMOS image sensors have lower manufacturing costs and a smaller size than charge coupled device (CCD) image sensors having a high-voltage analog circuit. Thus, CMOS image sensors have an advantage of low power consumption. In addition, the performance of CMOS image sensors has been improved as compared to an early development stage, and therefore, CMOS image sensors are usually used for various electronic appliances including portable devices such as smart phones and digital cameras.

A pixel array included in a CMOS image sensor includes a photoelectric conversion element in each pixel. The photoelectric conversion element generates an electrical signal varying with the quantity of incident light. The CMOS image sensor processes electrical signals to synthesize an image. With the recent requirement of high-resolution images, pixels included in the CMOS image sensor are required to be much smaller.

With the requirement of miniaturization, the size of pixels for image sensors gets smaller. With the decrease of the size of pixels, the area of an isolation film (e.g., a deep trench isolation (DTI)) formed between pixels has become an issue. The DTI is a dead zone that does not receive light. The quantity of light received by each pixel in a pixel array with DTI is less than that in a pixel array without DTI.

SUMMARY

Exemplary embodiments of the inventive concept provide an image pixel for increasing performance by reducing the area of a dead zone that does not receive light in an image sensor and an image sensor including the pixel.

According to an exemplary embodiment, there is provided a complementary metal-oxide-semiconductor (CMOS) image sensor which may include: a semiconductor substrate including a first surface and a third surface formed by removing a part of the semiconductor substrate from a second surface opposite to the first surface; a plurality of active regions which are formed between the first surface and the third surface and each of which includes a photoelectric conversion element generating charges in response to light input through the third surface; and an isolation region vertically formed from either of the first and third surfaces to isolate the active regions from one another. When viewed from the above of the third surface, each of the active regions may have round corners and concave sides.

When viewed from the above of the third surface, the active regions may include a first active region and a second active region.

A gap between a side of the first active region and a side of the second active region, facing each other, may be greater than a gap between a corner of the first active region and a corner of the second active region facing each other. Thus, a width of the isolation region between a center of a side of the first active region and a center of a side of the second active region, facing each other, may be greater than a width of the isolation region between a corner of the first active region and a corner of the second active region facing each other.

The isolation region may be a trench-type formed all along a vertical length of the semiconductor substrate from the first surface to the third surface.

According to an exemplary embodiment, there is provided an image sensor structure which may include: a substrate including a top surface and a bottom surface which is a light incident surface; a plurality of active regions vertically formed from the top surface to the bottom surface, and including photoelectric conversion element generating charges in response to light input through the third surface; and an isolation region vertically formed from one of the top surface and the bottom surface to the other to isolate the active regions from one another. Here, when viewed from the above of the bottom surface, each of the active regions may have round corners and concave sides, and, between the active regions, the isolation region is formed.

The active regions may include a first active region and a second active region, and, when viewed from the above of either of the top surface and the bottom surface, a gap between a side of the first active region and a side of the second active region, facing each other, may be greater than a gap between a corner of the first active region and a corner of the second active region facing each other. Here, the gap may be disposed at an area on which a border between two color filters is to be disposed to constitute an image sensor.

When viewed from the above of either of the top surface and the bottom surface, a width of the isolation region between a center of a side of the first active region and a center of a side of the second active region, facing each other, may be greater than a width of the isolation region between a corner of the first active region and a corner of the second active region facing each other. Here, a width of the isolation region between the two centers viewed from the above of the top surface may be greater than a width of the isolation region between the two centers viewed from the above of the bottom surface.

According to an exemplary embodiment, there is provided a CMOS image sensor which may include: a pixel array including a plurality of pixels which generate pixel signals in response to light incident on the CMOS image sensor; and a signal processing circuit configured to output image data based on the pixel signals. Here, each of the pixels may include the above-described image sensor structure.

BRIEF DESCRIPTION OF THE DRAWINGS

The above and other features and advantages of the inventive concept will become more apparent by describing in detail exemplary embodiments thereof with reference to the attached drawings, in which.

DETAILED DESCRIPTION OF THE EXEMPLARY EMBODIMENTS

Figure 1:
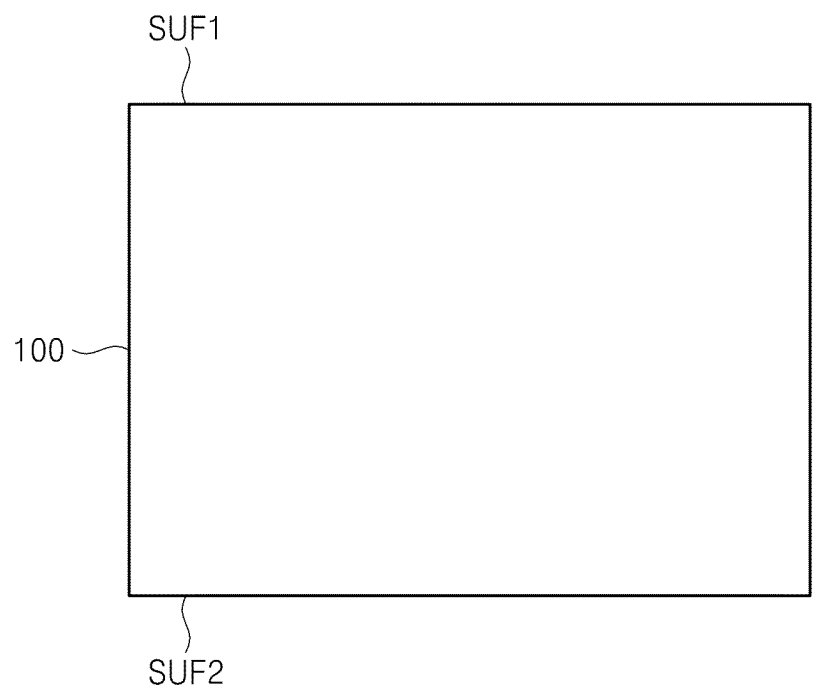
FIGS. 1 through 6 are cross-sectional views of a pixel in the stages of a method of manufacturing the pixel, according to exemplary embodiments.

The exemplary embodiments of the inventive concept now will be described more fully hereinafter with reference to the accompanying drawings. This inventive concept may, however, be embodied in many different forms and should not be construed as limited to the embodiments set forth herein. Rather, these embodiments are provided so that this disclosure will be thorough and complete, and will fully convey the scope of the inventive concept to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/". It will also be understood that when a layer is referred to as being "on" another layer or substrate, it can be directly on the other layer or substrate, or intervening layers may also be present.

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

FIGS. 1 through 6 are cross-sectional views of pixels in the stages of a method of manufacturing the pixels according to an exemplary embodiment. The stages illustrated in FIGS. 1 through 7 are just examples for describing a method of manufacturing the pixels. The stages (or processes) of manufacturing the pixels may vary by manufacturer.

Although it is described that a second stage is performed after a first stage and a third stage is performed after the second stage, the order of first through third stages may be changed and at least two of the three stages may be performed at the same time. Although it is described that a second layer (or a first element) is formed on or above a first layer (or a second element), one or more layers (or elements) may be formed (or embodied) between the first and second layers.

Referring to FIG. 1, a silicon (Si) substrate (e.g., a p+silicon substrate) 100 is prepared. Although the silicon substrate 100 is formed of a single layer in the exemplary embodiment illustrated in FIG. 1, the silicon substrate 100 may be formed of two or more layers. For instance, an epitaxial layer (e.g., a p–epitaxial layer) (not shown) may be formed on a silicon substrate (e.g., a p+silicon substrate) to constitute the silicon substrate 100 according to an exemplary embodiment. The p–epitaxial layer may be grown using a silicon source gas to have the same crystalline structure as the p+silicon substrate. The silicon source gas may include silane, dichlorosilane (DCS), trichlorosilane (TCS), hexachlorodisilane (HCDS), or a combination thereof. The silicon substrate 100 includes a first surface (or a top surface) SUF1 and a second surface (or a bottom surface) SUF2 opposite to the first surface SUF1.

Figure 2:
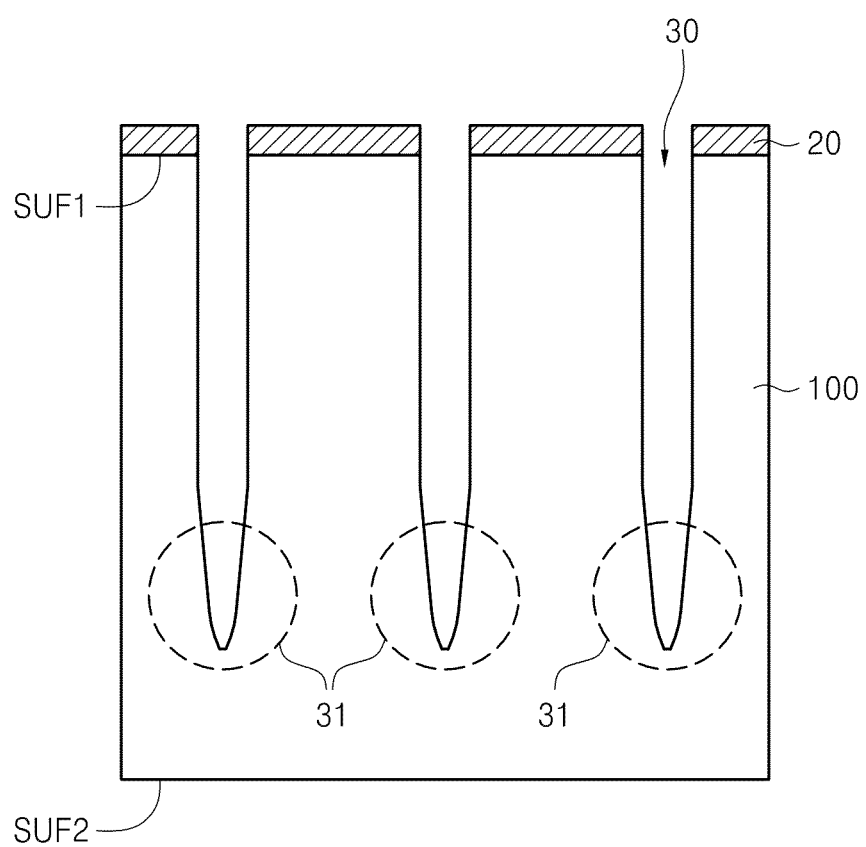

Referring to FIG. 2, a pattern 20 may be formed on the first surface SUF1 of the silicon substrate 100 to define an active region (120 in FIG. 7) and a region (hereinafter, referred to as an isolation film region 30) in which an isolation film (called a "isolation region" or a "isolation structure") will be formed. The isolation film is a structure artificially formed to electrically isolate elements from one another or active regions from one another. It may be a trench-type isolation film. The isolation film may be either a deep trench isolation (DTI) type or a shallow trench isolation (STI) type.

The silicon substrate 100 may be etched vertically from the first surface SUF1 toward the second surface SUF2 according to the pattern 20 to form the isolation film region 30. A bottom region 31 of the isolation film region 30 may be formed to become narrow toward a bottom end 33, as shown in FIG. 2. Accordingly, the area of a horizontal cross-section of the isolation film region 30 becomes narrow toward the bottom end 33. The horizontal cross-section of the isolation film region 30 will be described later with reference to FIGS. 7 and 8. The isolation film region 30 may be formed using either a wet etch or a dry etch.

Although the isolation film regions 30 are provided to form a front DTI vertically extending from the first surface SUF1 of the silicon substrate 100 in the current exemplary embodiment, but the inventive concept is not restricted to the current embodiment. According to another exemplary embodiments, the isolation film region 30 may be provided to form a back DTI vertically extending from the second surface SUF2 or a third surface SUF3 of the silicon substrate 100 toward the first surface SUF1.

Figure 3:
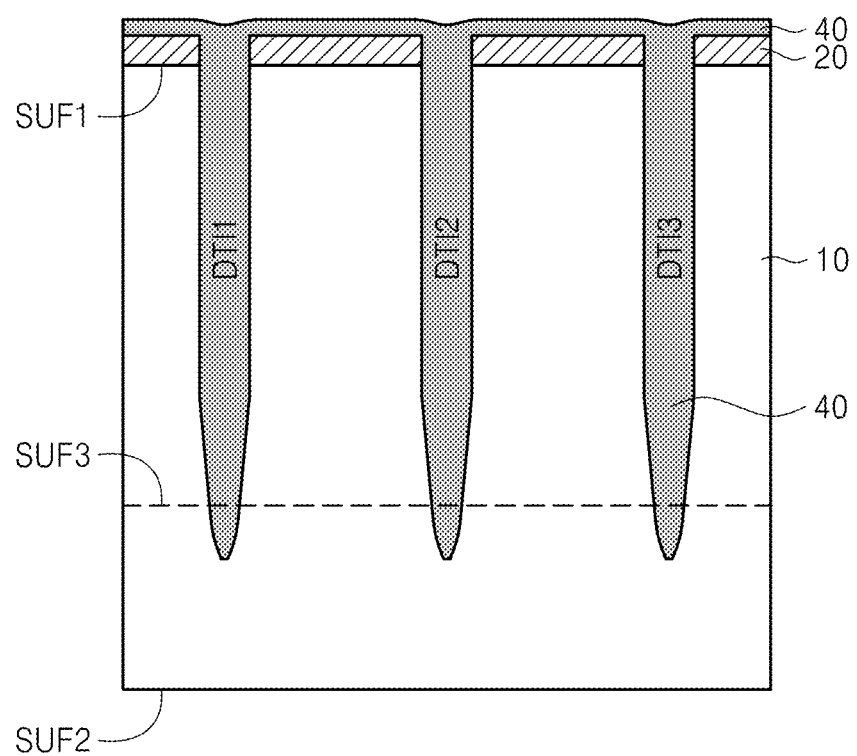

Referring to FIG. 3, the isolation film region 30 is filled with at least one type of material 40 through at least one stage. A material filling the isolation film region 30 may be oxide such as polysilicon or hafnium oxide.

In detail, a first material may be applied to a side wall of the isolation film region 30 and then the isolation film region 30 may be filled with a second material. Isolation films DTI1, DTI2, and DTI3 formed by filling the isolation film region 30 with the at least one type of material 40 may prevent electric crosstalk which leads to a decrease of a signal-to-noise ratio due to carrier exchange between adjacent active regions 120.

In addition, a side wall of the isolation films DTI1, DTI2, and DTI3 may be doped with a material having a high reflectance, so that an optical crosstalk decreasing a signal-to-noise ratio because light incident on a pixel, i.e., an active region, penetrates into an adjacent pixel (not shown) is prevented. The side wall of the isolation films DTI1, DTI2, and DTI3 may be formed of a polysilicon film doped with boron having a high reflectance, but the inventive concept is not restricted to the current exemplary embodiment.

A process of filling the isolation film region 30 with the at least one type of material 40 may vary by product or manufacturer. The isolation film region 30 may be filled with the at least one type of material 40 using chemical vapor deposition (CVD). The CVD is a process of exposing an object to precursor gas and applying external energy to yield a thin film through reaction such as chemical bonding, decomposition of the precursor gas, or the like. For instance, low power CVD (LPCVD) may be used to fill the isolation film region 30 with the at least one type of material 40.

Figure 4:
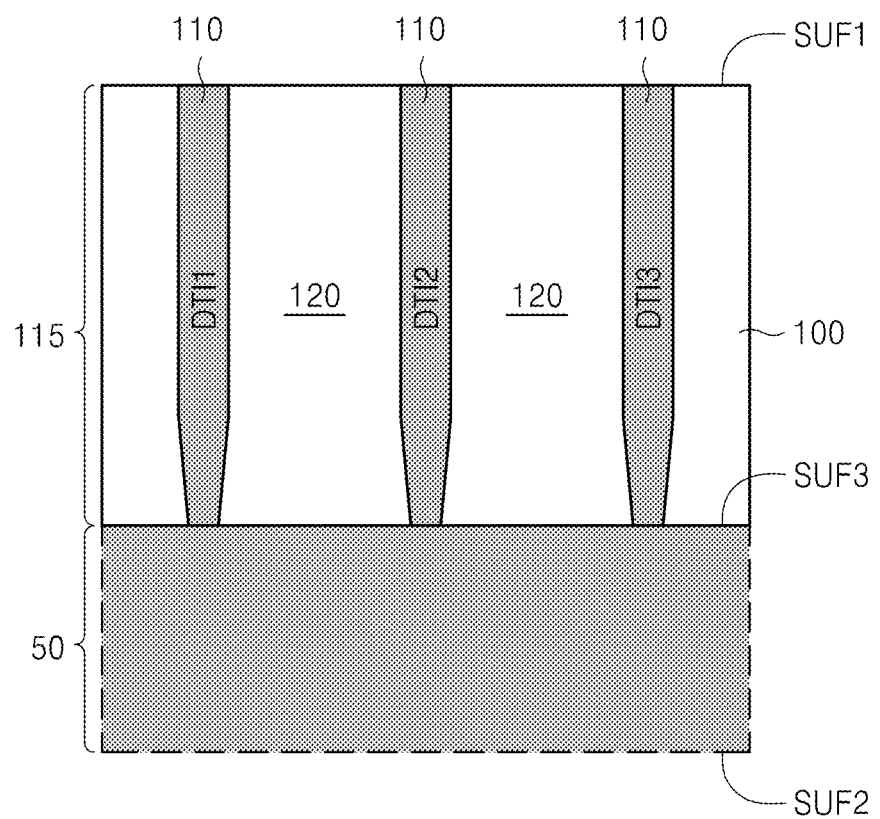

Referring to FIG. 4, a material deposited on the first surface SUF1 may be partially or entirely removed after the processing of filling the isolation film region 30 with the at least one type of material 40. The third surface SUF3 is exposed by removing a certain portion 50 of the silicon substrate 100. The certain portion 50 of the silicon substrate 100 may be removed by grinding the silicon substrate 100 to a predetermined thickness from the second surface SUF2 using a mechanical method and/or a chemical method. At this time, part of the bottom portion 31 of the isolation film 110 may also be removed. As a result, the isolation film 110 is formed extending from the first surface SUF1 to the third surface SUF3 all along the vertical length of a semiconductor substrate 115.

Figure 5:
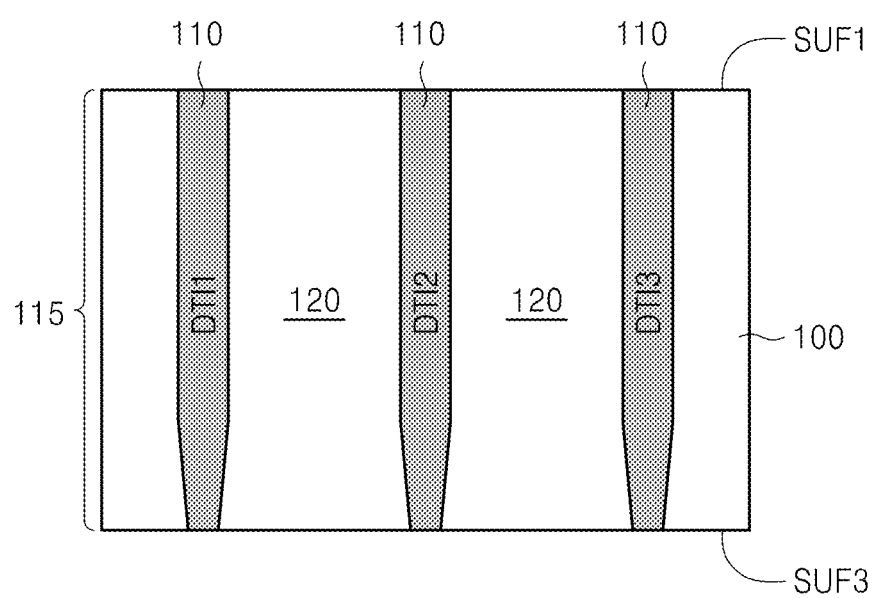

FIG. 5 is a vertical cross-sectional view of the pixels after the material deposited on the first surface SUF1 is removed and the certain portion 50 is removed from the silicon substrate 100.

Figure 6:
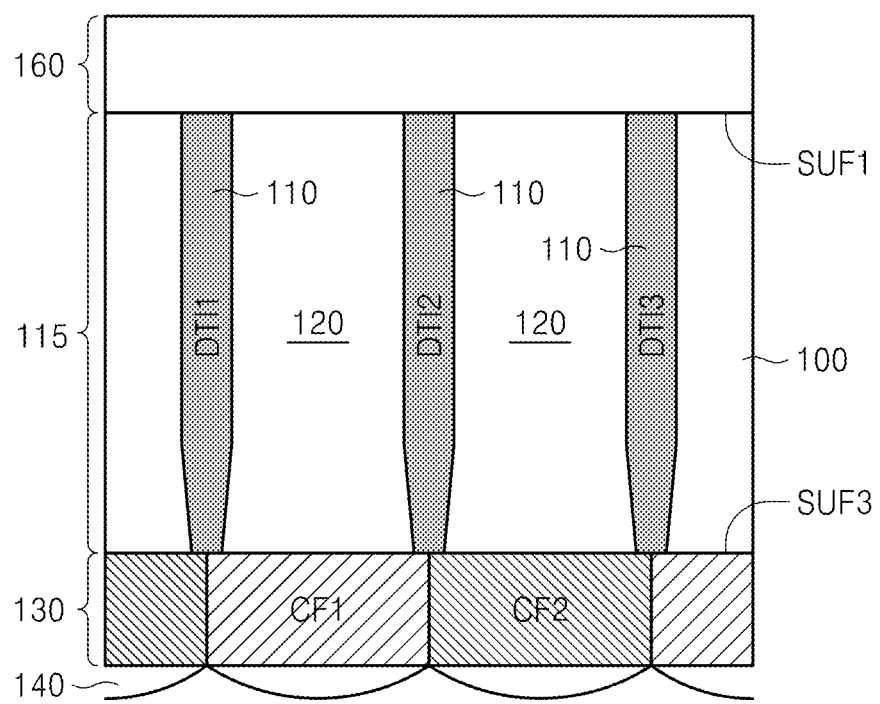

Referring to FIG. 6, a wiring layer 160 is formed on the first surface SUF1 of the silicon substrate 100. Before the wiring layer 160 is formed, elements (e.g., a photoelectric conversion element and a transistor) of the pixel may be formed.

The wiring layer 160 may include a gate (not shown) of a transistor of a pixel and multi-layer conductive lines (not shown). The conductive lines may transfer signals between transistors or the pixel and an external member. The conductive lines may be formed by patterning a conductive material including a metal such as copper or aluminum.

An incidence layer is formed below the third surface SUF3 of the silicon substrate 100. The incidence layer may include a color filter 130 and a micro lens 140. The micro lens 140 may be formed on the top (assumed as a place that incident light reaches first) of each pixel to correspond to the each pixel. The micro lens 140 may be used to increase light gathering power and thus to increase image quality.

The color filter 130 may be formed below the micro lens 140 and may selectively transmit light with a predetermined wavelength (e.g., red, green, blue, magenta, yellow, or cyan). A flat layer (not shown) may be formed between the color filter 130 and the third surface SUF3. The flat layer may prevent reflection of light coming through the micro lens 140 and the color filter 130. The flat layer may also be formed between the micro lens 140 and the color filter 130. The flat layer transmits incident light efficiently, thereby increasing the performance (such as light guiding efficiency and photo sensitivity) of an image sensor.

A photoelectric conversion element of the pixel may be formed in the active region 120. The photoelectric conversion element may generate charges in response to incident light. For instance, a photodiode, a phototransistor, a photogate, or a pinned photodiode may be formed in the active region 120.

In addition, a shallow isolation film, i.e., STI (not shown) may be formed in the active region 120 to isolate elements from one another in the pixel. A process of forming elements and the STI in the active region 120 may be performed before or after a DTI process.

In the current exemplary embodiment, an area other than a deep isolation film, i.e., a DTI between pixels, is referred to as the active region 120 or a pixel region.

Figure 7:
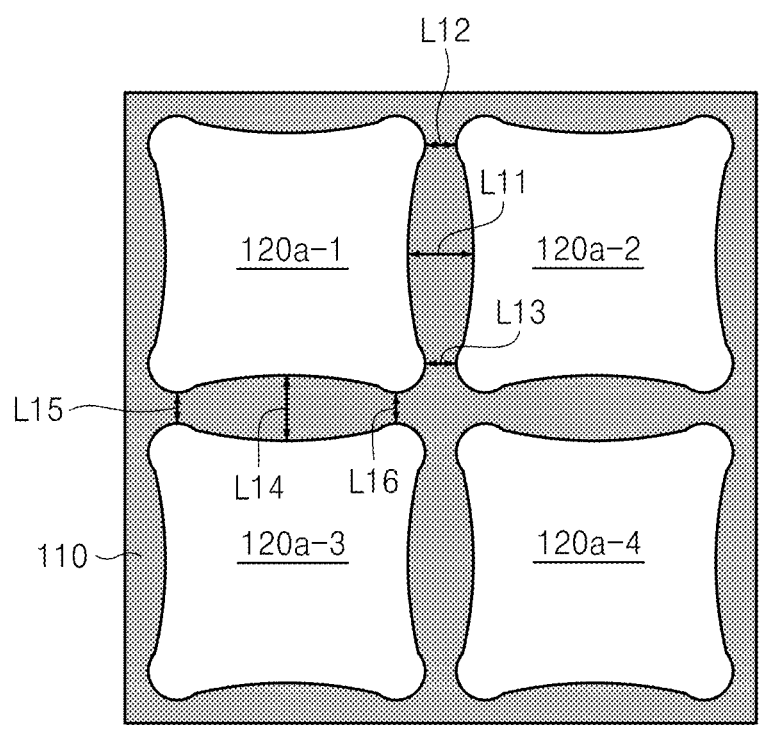
FIGS. 7 and 8 are horizontal cross-sectional views of pixels, according to exemplary embodiments.
Figure 8:
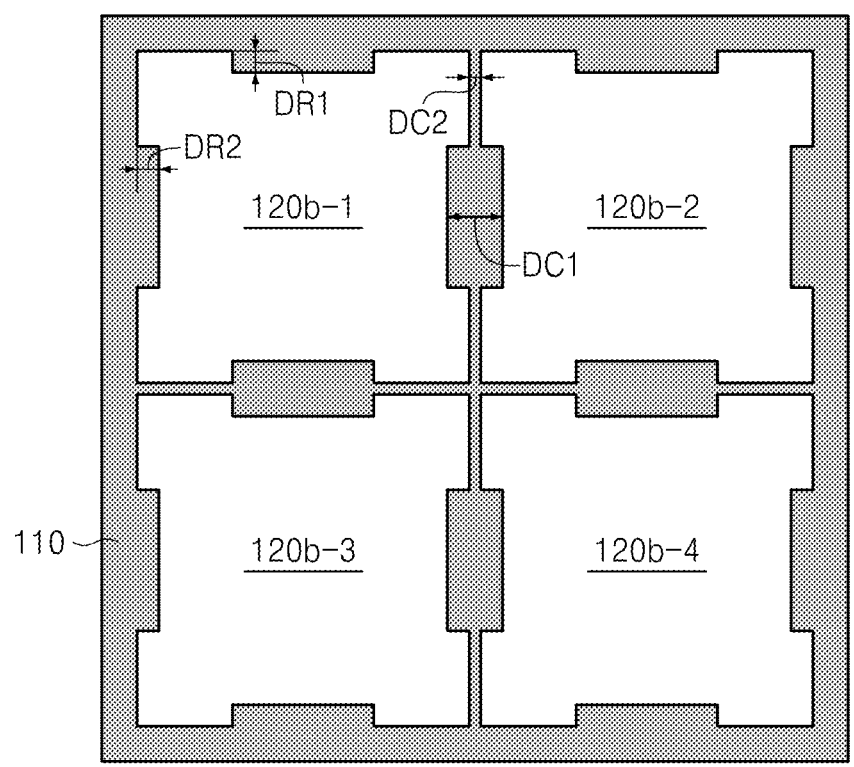

FIGS. 7 and 8 are horizontal cross-sectional views 200a and 200b of pixels according to an exemplary embodiment. These pixels may be obtained by the manufacturing method described above in reference to FIGS. 1-6. FIG. 7 is a horizontal cross-sectional view of pixels taken along the third surface SUF3 in the FIG. 6.

Referring to FIG. 7, the isolation film 110 is disposed between first through fourth active regions 120a-1, 120a-2, 120a-3, and 120a-4 to electrically isolate the active regions 120a-1, 120a-2, 120a-3, and 120a-4 from one another. The cross-section of the active regions 120a-1, 120a-2, 120a-3, and 120a-4 shows that each side of each active region is concave at the center, and each corner of the active region is rounded Thus, between two neighboring active regions (e.g., 120a-1 and 120a-2), the gap between the center of one side of an active region and the center of one side of another active region, facing each other (i.e., the width of the DTI between the two facing centers) is different from the gap between two corners, facing each other, of the two active regions (i.e., the width of the DTI between the two facing corners).

A gap L11 between a side of the first active region 120a-1 and a side of the second active region 120a-2 at the center is greater than a gap L12 or L13 between the side of the first active region 120a-1 and the side of the second active region 120a-2 at the end. A gap L14 between a side of the first active region 120a-1 and a side of the third active region 120a-3 at the center is greater than a gap L15 or L16 between the side of the first active region 120a-1 and the side of the third active region 120a-3 at the end.

Consequently, according to the cross-sections of pixels manufactured using the method according to the above exemplary embodiment, the widths L11 and L14 of the DTI at the centers of the sides of the active regions 120a-1, 120a-2, 120a-3, and 120a-4 are greater than the widths L12, L13, L15, and L16 of the DTI at the side ends of the active regions 120a-1, 120a-2, 120a-3, and 120a-4.

As described above, as the widths L12, L13, L15, and L16 of the DTI at the side ends of the active regions 120a-1, 120a-2, 120a-3, and 120a-4 are smaller than the widths L11 and L14 of the DTI at the centers of the sides of the same active regions, the size of a dead zone that does not receive light is reduced. As a result, a fill factor indicating light receiving performance is increased. The fill factor is the ratio of light receiving area of a pixel to total pixel area. The higher is the fill factor, the higher is the light guiding efficiency.

The pattern 20 formed on the first surface SUFI to form the cross-section illustrated in FIG. 7 may have a shape as shown in FIG. 8. In other words, the pattern 20 for defining the isolation film region 30 and the active region 120 may be formed in the shape shown in FIG. 8. A horizontal cross-sectional view of pixels taken along the first surface SUF1 in the FIG. 6 may be similar to or the same as that shown in FIG. 8.

Referring to FIG. 8, the isolation film 110 is disposed between first through fourth active regions 120*b*-1, 120*b*-2, 120*b*-3, and 120*b*-4 to electrically isolate the active regions 120*b*-1, 120*b*-2, 120*b*-3, and 120*b*-4 from one another. The cross-section of the active regions 120*b*-1, 120*b*-2, 120*b*-3, and 120*b*-4 may have four protruding corners. In detail, the DTI 110 may be formed such that, between two neighboring active regions (e.g., 120*b*-1 and 120*b*-2), the width of the DTI 110 between the centers of two sides, facing each other, of two active regions is greater than the width of the DTI 110 between two corners, facing each other, of the two active regions.

Also, a first length DR1 and a second length DR2 which indicate a protrusion length of each corner of the first active region 120*b*-1 is less than a half of the DTI width DC1 at the centers of two facing sides of the first active region 120*b*-1 and the second active region 120*b*-2.

Figure 9:
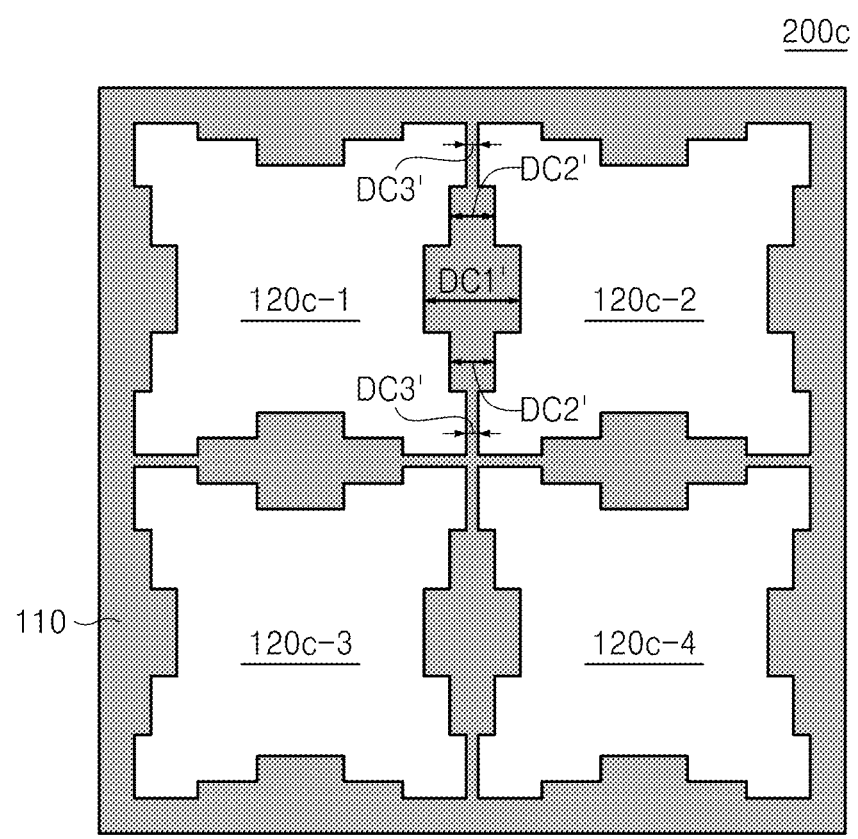
FIGS. 9 and 10 are horizontal cross-sectional views of pixels, according to exemplary embodiments.
Figure 10:
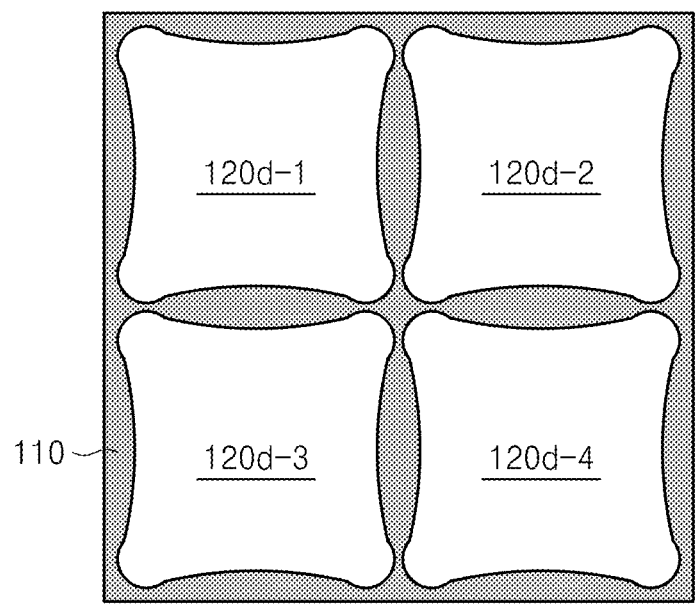

FIGS. 9 and 10 are horizontal cross-sectional views 200*c* and 200*d* of pixels according to an exemplary embodiment. These pixels may be obtained by the manufacturing method described above in reference to FIGS. 1-6. FIG. 9 is a horizontal cross-sectional view of pixels taken along the first surface SUF1 in the FIG. 6.

Referring to FIG. 9, the isolation film 110 is disposed between first through fourth active regions 120*c*-1, 120*c*-2, 120*c*-3, and 120*c*-4 to electrically isolate the active regions 120*c*-1, 120*c*-2, 120*c*-3, and 120*c*-4 from one another. The cross-section of the active regions 120*c*-1, 120*c*-2, 120*c*-3, and 120*c*-4 shows protruding corners like the cross-section illustrated in FIG. 8. In detail, the DTI 110 is formed such that the width of the DTI 110 between a portion between the center of one side and a corner of the first active region 120*c*-1 and a portion between the center of one side and a corner of the second active region 120*c*-2, facing each other, i.e., a DTI width DC2', is less than the width of the DTI 110 between the centers of the two sides, i.e., a DTI width DC1', but is greater than the width of the DTI 110 between the two corners, i.e., a DTI width DC3'.

As described above, the isolation film region 30 or the pattern 20 for defining the isolation film region 30 is formed such that a corner DTI width (i.e., the gap between active regions at the corners of the active regions) is less than a central DTI width (i.e., the gap between active regions at the centers of the sides of the active regions), as shown in FIGS. 8 and 9.

When the horizontal cross-sectional view taken along the first surface SUF1 is as shown in FIG. 9, the horizontal cross-sectional view taken along the third surface SUF3 may be as shown in FIG. 10. Referring to FIG. 10.

Referring to FIG. 10, the isolation film 110 is disposed between first through fourth active regions 120*d*-1, 120*d*-2, 120*d*-3, and 120*d*-4 to electrically isolate the active regions 120*d*-1, 120*d*-2, 120*d*-3, and 120*d*-4 from one another. The cross-section of the active regions 120*d*-1, 120*d*-2, 120*d*-3, and 120*d*-4 shows that each side of each active region is concave at the center, and ach corner of the active regions is rounded as described above for the exemplary embodiment illustrated in reference to FIG. 7. However, a corner DTI width is less than that in the exemplary embodiment illustrated in reference to FIG. 7.

In detail, the gap between the side of the first active region 120*d*-1 and the side of the active region 120*d*-2 at the corners (i.e., a corner DTI width) is much less than the gap between the side of the first active region 120*d*-1 and the side of the active region 120*d*-2 at the centers of these sides of the active regions 120*d*-1 and 120*d*-2 (i.e., a central DTI width).

According to the cross-sections of pixels manufactured using a method described above, the central DTI width is greater than the corner DTI width among the active regions 120*d*-1, 120*d*-2, 120*d*-3, and 120*d*-4. As described above, as the corner DTI width among the active regions 120*d*-1, 120*d*-2, 120*d*-3, and 120*d*-4 is smaller than the central DTI width thereof, the size of a dead zone that does not receive light is reduced. As a result, a fill factor is increased.

Although the description is focused on a CMOS image sensor having front DTI in the above exemplary embodiments, the inventive concept is not restricted to those exemplary embodiments. A CMOS image sensor may have back DTI according to another exemplary embodiment.

To form back DTI, the silicon substrate 100 including the first surface (or the top surface) SUF1 and the second surface (or the bottom surface) SUF2 opposite to the first surface SUF1 may be prepared, as shown in FIG. 1. The third surface SUF3 may be formed by removing the silicon substrate 100 to a predetermined thickness from the second surface SUF2 using mechanical and/or chemical grinding (e.g., chemical mechanical polishing (CMP)).

After the grinding, a pattern may be formed on the third surface SUF3 of the silicon substrate 100 to define the region 30 in which an isolation film will be formed and the active region 120. At this time the shape of the pattern may be similar to the cross-sectional view of FIG. 7 or 10. Accordingly, as shown in FIG. 7 or 10, the back DTI may be formed such that a corner DTI width (i.e., the gap between active regions at their corners) is less than a central DTI width (i.e., the gap between the active regions at their centers).

Figure 11:
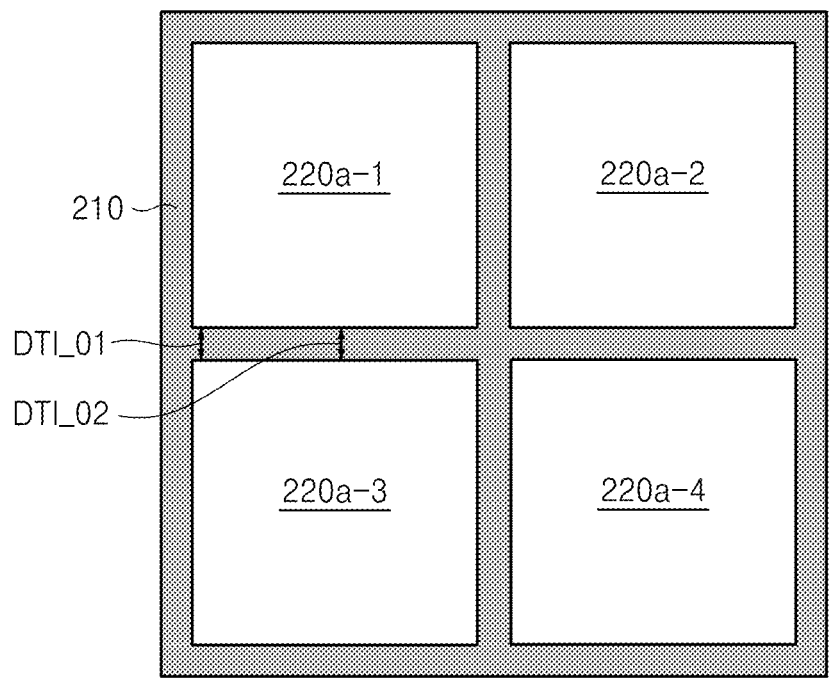
FIGS. 11 and 12 are horizontal cross-sectional views of pixels in comparison examples.
Figure 12:
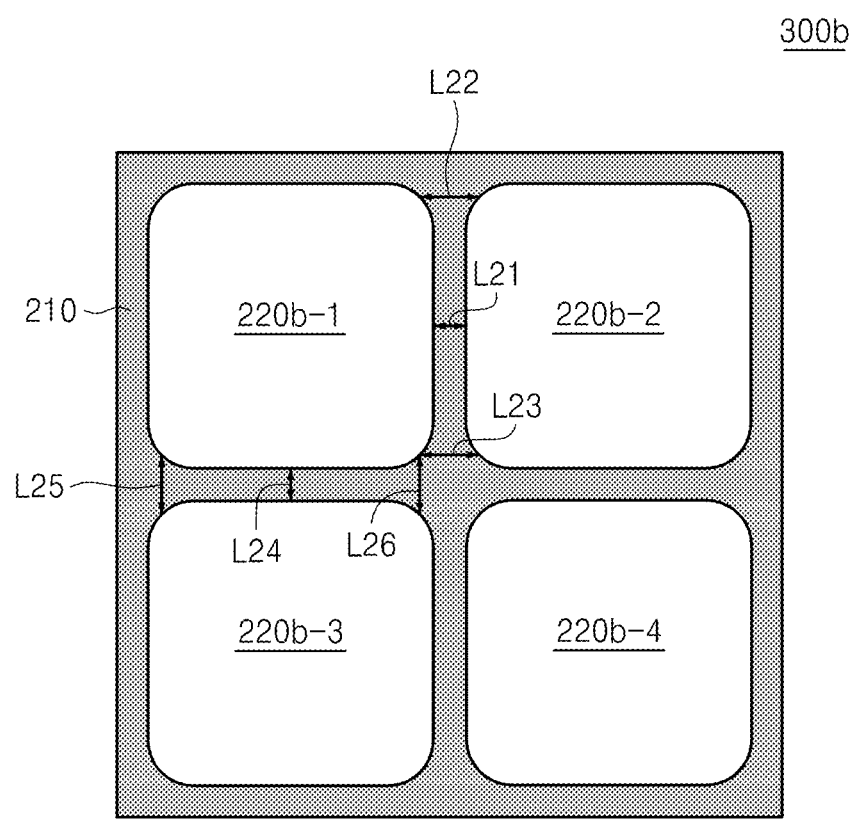

FIGS. 11 and 12 are horizontal cross-sectional views 300*a* and 300*b* of pixels in comparison examples. In detail, FIG. 11 is a comparison example corresponding to the horizontal cross-sectional view 200*b* of FIG. 8 and FIG. 12 is a comparison example corresponding to the horizontal cross-sectional view 200*a* of FIG. 7. Accordingly, the horizontal cross-sectional views 300*a* and 300*b* of FIGS. 11 and 12 will be compared with the horizontal cross-sectional views 200*b* and 200*a* of FIGS. 8 and 7.

Referring to FIG. 11, the cross section of first through fourth active regions 220*a*-1, 220*a*-2, 220*a*-3, and 220*a*-4 at a side opposite to a side on which light is incident may be quadrilateral. Accordingly, there is not much difference in the gap between the side of one active region (e.g., 220*a*-1) and the side of an adjacent active region (e.g., 220*a*-2 or 220*a*-3) between the center and the corner of the active regions. In other words, a central DTI width DTI_02 is almost the same as a corner DTI width DTI_01.

Referring to FIG. 12, an isolation film 210 is disposed among active regions 220*b*-1, 220*b*-2, 220*b*-3, and 220*b*-4 at the side on which light is incident in order to electrically isolate the active regions 220*a*-1, 220*a*-2, 220*a*-3, and 220*a*-4 from one another. As for the gap between the side of one active region (e.g., 220*b*-1) and the side of an adjacent active region (e.g., 220*b*-2), the gap at the corners (i.e., a corner DTI width) is greater than the gap at the centers (i.e., a central DTI width). In detail, a gap L22 or L23 between the corners of the respective active regions 220*b*-1 and 220*b*-2 is greater than a gap L21 between the centers thereof and a gap L25 or L26 between the corners of the respective active regions 220b-1 and 220b-3 is greater than a gap L24 between the centers thereof. As a result, the size of the dead zone that does not receive light in a pixel increases, and therefore, a fill factor decreases.

Figure 13:
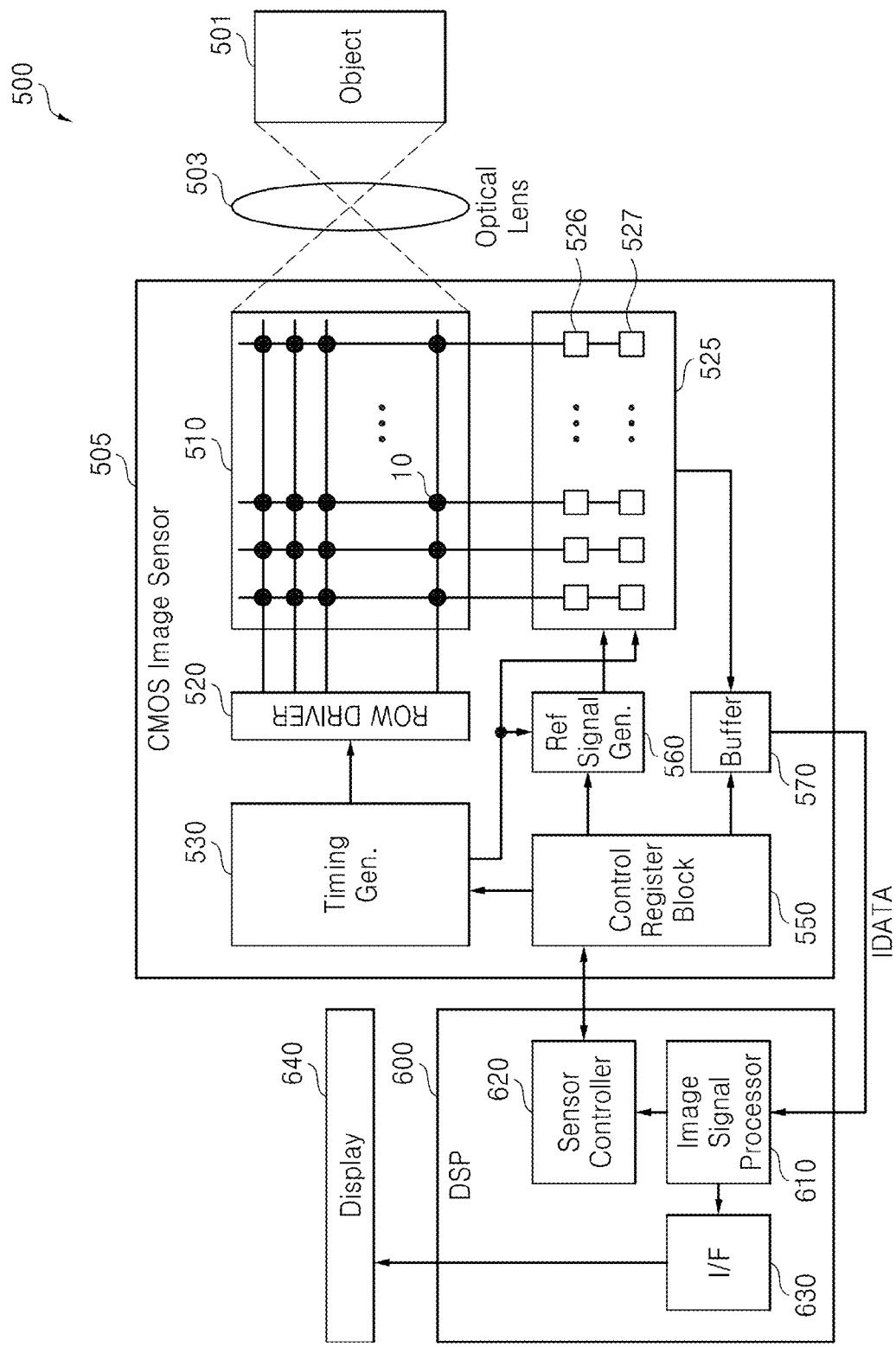
FIG. 13 is a block diagram of an image processing system including a pixel, according to an exemplary embodiment.

FIG. 13 is a block diagram of an image processing system 500 including a pixel obtained through the above described manufacturing process, according to an exemplary embodiment. Referring to FIGS. 1 through 10 and 13, the image processing system 500 may be implemented as a digital camera, a camcorder, or a portable electronic device including a complementary metal-oxide-semiconductor (CMOS) image sensor 505. The portable electronic device may be a cellular phone, a smart phone, a tablet personal computer (PC), a mobile internet device (MID), a wearable computer, an internet of things (IoT) device, or an internet of everything (IoE) device. The image processing system 500 includes an optical lens 503, the CMOS image sensor 505, a digital signal processor (DSP) 600, and a display 640.

The CMOS image sensor 505 may generate image data IDATA corresponding to an object input through the optical lens 503. The CMOS image sensor 505 includes a pixel array 510, a row driver 520, a readout circuit 525, a timing generator 530, a control register block 550, a reference signal generator 560, and a buffer 570. A signal processing circuit may include the readout circuit 525 and the buffer 570.

The pixel array 510 includes a plurality of pixels 10 generating a plurality of pixel signals in response to incident light. The pixels 10 may be manufactured using such processes as described with reference to FIGS. 1 through 6. The pixels 10 are arranged in a matrix. Each of the pixels 10 sends an output signal to a corresponding column line.

The row driver 520 drives control signals for controlling the operation of the pixels 10 to the pixel array 510 according to the control of the timing generator 530. The row driver 520 may control the operations of the pixels 10 row by row. The row driver 520 may function as a control signal generator that generates the control signals.

The timing generator 530 controls the operations of the row driver 520, the readout circuit 525, and the reference signal generator 560 according to the control of the control register block 550. The readout circuit 525 includes an analog-to-digital converter (ADC) 526 for each column and a memory 527 for each column. The ADC 526 may perform correlated double sampling (CDS). The readout circuit 525 outputs a digital image signal corresponding to a pixel signal output from each of the pixels 10.

The control register block 550 controls the operations of the timing generator 530, the reference signal generator 560, and the buffer 570 according to the control of the DSP 600. The buffer 570 transmits the image data IDATA corresponding to digital image signals output from the readout circuit 525 to the DSP 600. The signal processing circuit may process (e.g., perform CDS and analog-to-digital conversion on) the pixel signals output from the pixel array 510 and may output the image data IDATA corresponding to the processing result.

The DSP 600 includes an image signal processor 610, a sensor controller 620, and an interface (I/F) 630. The image signal processor 610 controls the I/F 630 and the sensor controller 620 which controls the control register block 550. The CMOS image sensor 505 and the DSP 600 may be respectively implemented in chips in a single package, e.g., a multi-chip package. Alternatively, the CMOS image sensor 505 and the image signal processor 610 may be respectively implemented in chips in a single package, e.g., a multi-chip package.

The image signal processor 610 processes the image data IDATA received from the buffer 570 and transmits processed image data to the I/F 630. The sensor controller 620 may generate various control signals for controlling the control register block 550 according to the control of the image signal processor 610. The I/F 630 may transmit the processed image data from the image signal processor 610 to the display 640. The display 640 may display the image data output from the I/F 630.

Figure 14:
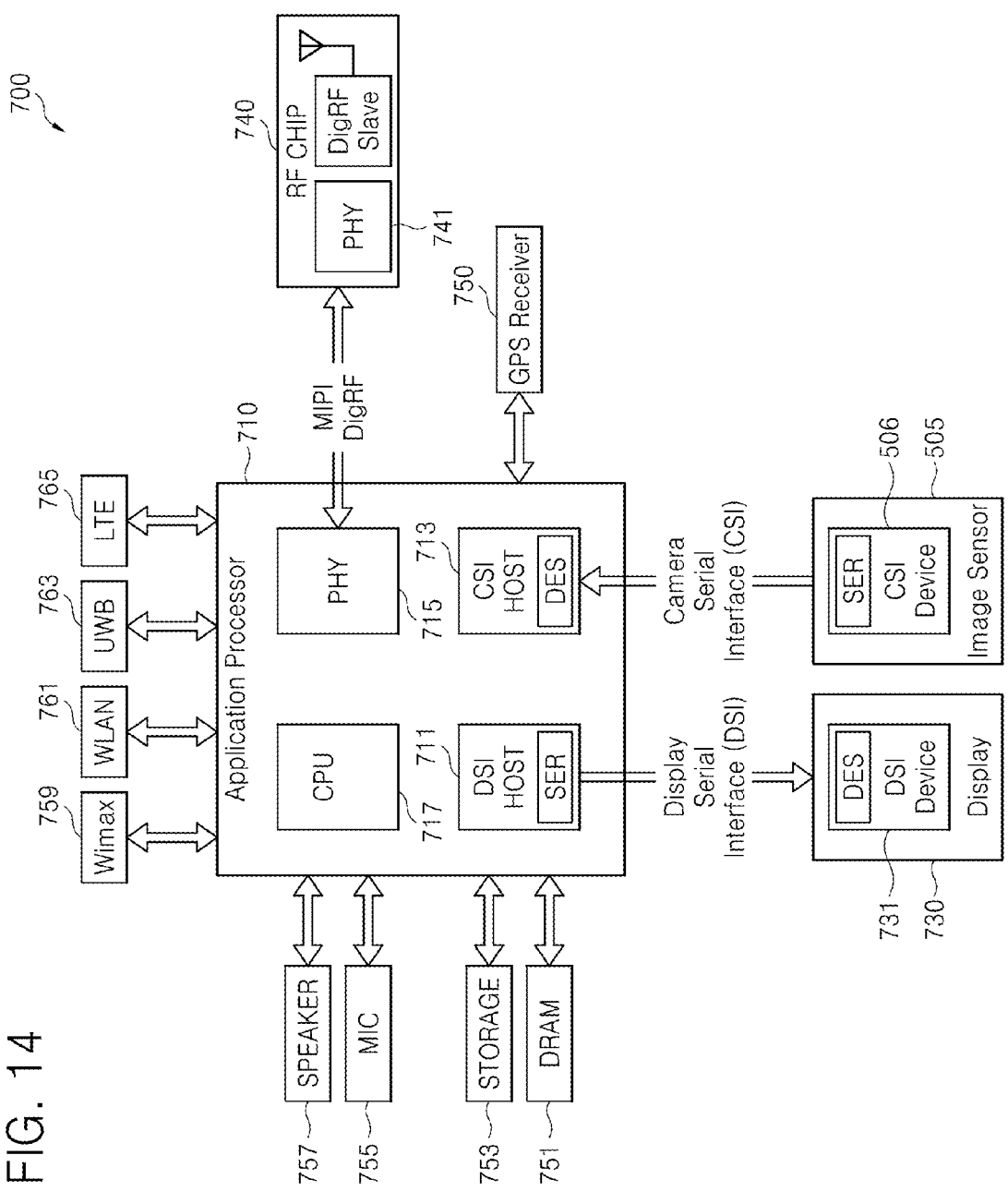
FIG. 14 is a block diagram of an image processing device including a pixel, according to an exemplary embodiment.

FIG. 14 is a block diagram of an image processing device 700 including a pixel obtained through the above manufacturing process, according to an exemplary embodiment. Referring to FIGS. 1 through 10 and 14, the image processing device 700 may be implemented as a portable electronic device that can use or support mobile industry processor interface (MIPI®). The portable electronic device may include the CMOS image sensor 505 and a processing circuit for processing the image data IDATA output from the CMOS image sensor 505. The image processing device 700 includes an application processor (AP) 710, the image sensor 505, and the display 730.

A camera serial interface (CSI) host 713 in the AP 710 may perform serial communication with a CSI device 506 in the image sensor 505 through CSI. A deserializer DES and a serializer SER may be included in the CSI host 713 and the CSI device 506, respectively. The AP 710 may be implemented as an integrated circuit or a system on chip (SoC).

A display serial interface (DSI) host 711 in the AP 710 may perform serial communication with a DSI device 731 in the display 730 through DSI. A serializer SER and a deserializer DES may be included in the DSI host 711 and the DSI device 731, respectively. The deserializers DES and the serializers SER may process electrical signals or optical signals.

The image processing device 700 may also include a radio frequency (RF) chip 740 communicating with the AP 710. A physical layer (PHY) 715 in the AP 710 and a PHY 741 in the RF chip 740 may communicate data with each other according to MIPI DigRF. A central processing unit (CPU) 717 may control the operations of the DSI host 711, the CSI host 713, and the PHY 715.

The image processing device 700 may further include a global positioning system (GPS) receiver 750, a memory 751 such as dynamic random access memory (DRAM), a data storage 753 formed using non-volatile memory such as NAND flash-based memory, a microphone (MIC) 755, and/or a speaker 757. The image processing device 700 may communicate with external devices using at least one communication protocol or standard, e.g., worldwide interoperability for microwave access (Wimax) 759, wireless local area network (WLAN) 761, ultra-wideband (UWB) 763, or long term evolution (LTE™) 765. The image processing device 700 may also communicate with external wireless communication device using Bluetooth or Wi-Fi.

As described above, according to the above exemplary embodiments, the size of the dead zone that does not receive light is reduced, and therefore, a fill factor is increased.

The operations or steps of the methods or algorithms described above can be embodied as computer readable codes on a computer readable recording medium, or to be transmitted through a transmission medium. The computer readable recording medium is any data storage device that can store data which can be thereafter read by a computer system. Examples of the computer readable recording medium include read-only memory (ROM), random-access memory (RAM), compact disc (CD)-ROM, digital versatile disc (DVD), magnetic tape, floppy disk, and optical data storage device, not being limited thereto. The transmission medium can include carrier waves transmitted through the Internet or various types of communication channel. The computer readable recording medium can also be distributed over network coupled computer systems so that the computer readable code is stored and executed in a distributed fashion.

While the inventive concept has been particularly shown and described with reference to exemplary embodiments thereof, it will be understood by those of ordinary skill in the art that various changes in forms and details may be made therein without departing from the spirit and scope of the inventive concept as defined by the following claims.

What is claimed is:

1. A complementary metal-oxide-semiconductor (CMOS) image sensor comprising:
   a semiconductor substrate comprising a first surface and a third surface formed by removing a part of the semiconductor substrate from a second surface opposite to the first surface;
   a plurality of active regions which are formed between the first surface and the third surface and each of which comprises a photoelectric conversion element generating charges in response to light input through the third surface; and
   an isolation region vertically formed from either of the first and third surfaces to isolate the active regions from one another,
   wherein, when viewed from the above of the third surface, each of the active regions has round corners and concave sides,
   wherein the active regions comprise a first active region and a second active region, and
   wherein, when viewed from the above of the third surface, a distance between a top side of the first active region and a top side of the second active region, facing each other, is greater than a distance between a corner of the first active region and a corner of the second active region facing each other.

2. The CMOS image sensor of claim 1, wherein, when viewed from the above of the third surface, a width of the isolation region between a center of a side of the first active region and a center of a side of the second active region, facing each other, is greater than a width of the isolation region between a corner of the first active region and a corner of the second active region facing each other.

3. The CMOS image sensor of claim 1, wherein the isolation region is formed all along a vertical length of the semiconductor substrate from the first surface to the third surface.

4. The CMOS image sensor of claim 1, wherein the isolation region is formed using a back trench process or a front trench process.

5. The CMOS image sensor of claim 1, wherein, when viewed from the above of the first surface, each of the active regions has four corners that protrude.

6. The CMOS image sensor of claim 1, further comprising a light incidence layer formed below the third surface,
   wherein the light incidence layer comprises:
   a micro lens on which light is incident; and
   a color filter configured to selectively transmit the light incident on the micro lens, and
   wherein the selectively transmitted light is input to the photoelectric conversion element in each of the active regions through the third surface.

7. The CMOS image sensor of claim 1, further comprising a wiring layer formed on the first surface.

8. An image sensor structure comprising:
   a substrate comprising a top surface and a bottom surface which is a light incident surface;
   a plurality of active regions vertically formed from the top surface to the bottom surface, and comprising a photoelectric conversion element generating charges in response to light input through the bottom surface; and
   an isolation region vertically formed from one of the top surface and the bottom surface to the other to isolate the active regions from one another,
   wherein, when viewed from the above of the bottom surface, each of the active regions has round corners and concave sides, and, between the active regions, the isolation region is formed,
   wherein the active regions comprise a first active region and a second active region, and
   wherein, when viewed from the above of either of the top surface and the bottom surface, a distance between a top side of the first active region and a top side of the second active region, facing each other, is greater than a distance between a corner of the first active region and a corner of the second active region facing each other.

9. The image sensor structure of claim 8, wherein the distance corresponds to an area on which a border between two color filters is to be disposed to constitute an image sensor.

10. The image sensor structure of claim 8, wherein, when viewed from the above of either of the top surface and the bottom surface, a width of the isolation region between a center of a side of the first active region and a center of a side of the second active region, facing each other, is greater than a width of the isolation region between a corner of the first active region and a corner of the second active region facing each other.

11. The image sensor structure of claim 10, wherein a width of the isolation region between the two centers viewed from the above of the top surface is greater than a width of the isolation region between the two centers viewed from the above of the bottom surface.

12. A complementary metal-oxide-semiconductor (CMOS) image sensor comprising:
    a pixel array comprising a plurality of pixels configured to generate pixel signals in response to light incident on the CMOS image sensor; and
    a signal processing circuit configured to output image data based on the pixel signals,
    wherein each of the pixels comprises the image sensor structure of claim 8.

13. The CMOS image sensor of claim 12, wherein the distance corresponds to an area on which a border of color filters is to be disposed to constitute the CMOS image sensor.

14. The CMOS image sensor of claim 12, wherein, when viewed from the above of either of the top surface and the bottom surface, a width of the isolation region between a center of a side of the first active region and a center of a side of the second active region, facing each other, is greater than a width of the isolation region between a corner of the first active region and a corner of the second active region facing each other.

15. The CMOS image sensor claim 14, wherein a width of the isolation region between the centers viewed from the above of the top surface is greater than a width of the isolation region between the centers viewed from the above of the bottom surface.

16. The CMOS image sensor of claim 12, wherein the isolation region is formed along a vertical length of the semiconductor substrate from the top surface to the bottom surface.

17. The CMOS image sensor of claim 12, further comprising a light incidence layer formed below the bottom surface, wherein the light incidence layer comprises:

a micro lens on which the light is incident; and a color filter configured to selectively transmit the light incident on the micro lens, and wherein the selectively transmitted light is input to the photoelectric conversion element in each of the active regions through the bottom surface.

* * * * *

UNITED STATES PATENT AND TRADEMARK OFFICE
CERTIFICATE OF CORRECTION

Page 1 of 1

PATENT NO. : 9,608,024 B2
APPLICATION NO. : 14/872691
DATED : March 28, 2017
INVENTOR(S) : Seung Wook Lee et al.

It is certified that error appears in the above-identified patent and that said Letters Patent is hereby corrected as shown below:

In the Claims

Claim 13, Column 12, Line 52, delete "distance corresponds" and insert --distances correspond--;

Claim 14, Column 12, Line 57, after between, delete "a" and insert --the--;

Claim 14, Column 12, Line 58, each recitation of "a", should read --the--;

Claim 14, Column 12, Line 60, after between, delete "a" and insert --the--;

Claim 14, Column 12, Line 61, after and, delete "a" and insert --the--.

Claim 16, Column 13, Line 3, delete "semiconductor";

Claim 17, Column 13, Line 12, after input to, delete "the" and insert --a--.

Signed and Sealed this
Third Day of August, 2021

Drew Hirshfeld
*Performing the Functions and Duties of the
Under Secretary of Commerce for Intellectual Property and
Director of the United States Patent and Trademark Office*